United States Patent [19]

Fujita

[11] Patent Number: 4,912,546
[45] Date of Patent: Mar. 27, 1990

[54] LEAD FRAME AND METHOD OF FABRICATING A SEMICONDUCTOR DEVICE

[75] Inventor: Katsufusa Fujita, Kitakyushu, Japan

[73] Assignee: Mitsui High-Tec Inc.

[21] Appl. No.: 255,294

[22] Filed: Oct. 11, 1988

Related U.S. Application Data

[63] Continuation-in-part of Ser. No. 875,160, Jun. 17, 1986.

[30] Foreign Application Priority Data

Mar. 6, 1986 [JP] Japan .................. 61-49196

[51] Int. Cl.$^4$ .................. H01L 23/52; H01L 23/12
[52] U.S. Cl. .................. 357/70; 357/68
[58] Field of Search ............ 357/70, 68; 174/52.2; 361/421; 439/88.9, 885

[56] References Cited

U.S. PATENT DOCUMENTS

| | | | |
|---|---|---|---|
| 2,336,385 | 12/1943 | Batcheller | 439/889 |
| 3,361,251 | 1/1968 | Olsson | 439/885 |
| 3,837,001 | 9/1974 | Hughes et al. | 357/65 |
| 4,395,087 | 7/1983 | Gorre et al. | 439/885 |
| 4,438,181 | 3/1984 | Schroeder | 357/70 |
| 4,663,651 | 5/1987 | Gilder et al. | 357/70 |

FOREIGN PATENT DOCUMENTS

| | | | |
|---|---|---|---|
| 59-155159 | 9/1984 | Japan | 357/70 |
| 60-19365 | 10/1985 | Japan | 357/70 |

*Primary Examiner*—Rolf Hille
*Assistant Examiner*—S. V. Clark

*Attorney, Agent, or Firm*—Schwartz & Weinrieb

[57] ABSTRACT

A lead frame and a method of forming the same for a semiconductor device includes a pad section (20a) and a lead section (20b) which are formed separately. The former comprises a die pad (21) upon which a semiconductor element is to be mounted, and a pair of support bars (26) extending outwardly from opposite side edges thereof. The lead section (20b) includes frame members (25), outer leads (24), inner leads (22), and tie bars (23) interconnecting the outer and inner leads together in an integral manner. The outer free or distal ends of the pad section support bars (26) are provided with first male engaging enlargements (26a), while the frame members (25) of the lead section (20b) are provided with second female recesses (25a) at predetermined positions along the longitudinal extent of the frame members (25) such that when the pad section (20a) is mounted upon or within the lead section (20b) of the lead frame (20) as a result of the engagement of the first and second engagements (26a, 25a), the support bars (26) and die pad (21) will be locked and fixed with respect to any lateral movement relative to the frame members (25) along the longitudinal extent thereof whereby the pad (21), and the semiconductor element mounted thereon, will be precisely and accurately located relative to the inner leads (22) of the lead frame (20) so as to define uniform spacing between the semiconductor element terminals and the inner leads in order to efficiently facilitate the wire bonding process to be subsequently performed between the semiconductor element terminals and the inner leads (22) of the lead frame (20).

20 Claims, 2 Drawing Sheets

- 25a
- 25
- 20 LEAD FRAME
- 21 PAD
- 22 INNER LEAD
- 23 TIE BAR
- 24 OUTER LEAD
- 25 FRAME MEMBER
- 26a
- 26 SUPPORT BAR

- 26a
- 20a
- 21
- 26
- 26a

LEAD FRAME AND METHOD OF FABRICATING A SEMICONDUCTOR DEVICE

CROSS-REFERENCE TO RELATED PATENT APPLICATION

This U.S. patent application is continuation-in-part of U.S. patent application Ser. No. 875,160 filed June 17, 1986.

BACKGROUND OF THE INVENTION

1. Field of the Invention

The present invention relates generally to a lead frame for use in the manufacture of a semiconductor device, and to a method of fabricating a semiconductor device using the lead frame of the invention.

2. Description of the Prior Art

A semiconductor device, such as, for example, an integrated circuit (IC) or an LSI is fabricated as shown in FIG. 4 by properly plating a pad section 11; forming the inner tip ends of inner leads 12 of the lead frame, generally indicated by the reference character 10, by means of suitable blanking or etching operations performed upon a strip-shaped steel plate; fixedly mounting a semiconductor element, not shown, upon the pad section 11; interconnecting the terminals of the semiconductor element with the inner tip ends of the inner leads 12 by means of a suitable bonding process utilizing gold wire or the like for establishing good electrical interconnections therebetween; sealing the resultant assembly with a suitable resin; and finally severing appropriate portions of the tie bars 13, which serve to interconnect the inner and outer leads 12 and 14, respectively, by suitable trimming and forming processes.

The tie bars 13 function to stabilize the outer leads 14 of the lead frame until completion of the assembling operation, and they also serve to prevent any leakage of the sealing resin during the sealing operation of the assembly. Furthermore, the pad 11 is supported by means of a pair of support bars 16 which extend outwardly from opposite side edge portions of a frame member 15 toward opposite side edge portions of the pad 11, the pad 11, support bars 16, and frame member 15 being integrally formed together.

In fabricating the above-described semiconductor device, since the fixed mounting of the semiconductor element, not shown, upon the central pad member 11 is achieved by means of thermo-compression bonding or similar techniques, the pad member 11, as well as any other elements within the vicinity thereof, has its temperature raised to approximately 400°–500° C. Consequently, in view of the fact that the inner leads 12 may have, for example, their tip ends plated with a suitable metal having a relatively low melting temperature, the aforenoted technique has exhibited manufacturing defects in that the fixed mounting process achieved in connection with respect to the semiconductor element upon the central pad member 11 has simultaneously caused the undesirable melting of the plated metal upon the tip ends of the inner leads 12. Furthermore, it has also been realized that as a result of the aforenoted thermo-compression bonding or similar techniques employed in connection with the fixation of the semiconductor element upon the central pad member 11, thermal deformation of the various components, for example, the tip ends of the inner leads 12, has also occurred whereby the spacings defined between the inner leads 12 has been rendered non-uniform. This phenomenon has, in turn, present difficulties in connection with the proper and efficient performance of the aforenoted wire bonding process or technique between the terminals of the semiconductor element and the inner leads 12 of the lead frame 10.

In an attempt to rectify or overcome the aforenoted problems, it is also conventionally known and practiced to separately form or fabricate the frame member, with its inner and outer leads, and interconnecting tie bars, with respect to the pad member and its support bars. This type of prior art is exemplified by means of, for example, Japanese Patent Publication No. 60-193365 which issued to Toshinori Tanaka and was published on Oct. 1, 1985. In such patent publication, the pad member 4 and the support bars 7 thereof have been fabricated separately and distinctly from the frame member 6 which is integrally formed with inner leads 2 and outer leads 1, as well as interconnecting tie bars 3. The pad member 4 and its support bars 7 are then subsequently affixed to the frame member portions 6 by means of welding the same thereto at connecting portions 5. Consequently, while this prior art reference teaches a fabrication technique which appears to overcome the aforenoted problem with respect to the fabrication of the entire lead frame as a single entity whereupon the deformation and melting problems are ordinarily encountered, the reference nevertheless lacks any teaching or means of resolving the problem wherein non-uniform spacing occurs or is defined between the inner leads of the lead frame, or between the inner leads and the semiconductor element disposed upon the central semiconductor pad member. In particular, while welding regions are disclosed at 5 in FIG. 2 of the Tanaka publication for welding or brazing attachment with similarly noted sections 5 of the pad member support bars 7, as shown in FIG. 3 of the Tanaka publication, there is no provision of means for precisely or accurately defining the lateral positioning of the pad member 4 and the support bars 7 relative to sections or regions 5 of the frame members 6 and along the longitudinal extent thereof, or more particularly, extending in the lateral direction, that is, left to right or right to left, as viewed in the drawing FIG. 2 of the Tanaka publication. Consequently, the disposition of the pad member 4, with its semiconductor element, not shown, disposed thereon and having terminals thereof for electrical connection with the inner leads 2 of the lead frame of Tanaka, relative to the inner leads 2, cannot be accurately or precisely achieved whereby the aforenoted wire bonding process difficulties remain unresolved.

OBJECTS OF THE INVENTION

Accordingly, it is an object of the present invention to provide a lead frame which comprises a central semiconductor element pad section and a lead section which are made from different materials, and have different plate thicknesses, so as to reduce the adverse effects of heat, upon a semiconductor device, which is generated during the mounting of the semiconductor element upon the semiconductor pad section.

Another object of the present invention is to provide a method of fabricating a semiconductor device which enables the fixed mounting of a semiconductor element upon a semiconductor pad section of a lead frame at a location remote from the lead section of the lead frame, thus ensuring that the lead sections of the lead frame are prevented from being subjected to the heat generated during the mounting process attendant the mounting of the semiconductor element upon the semiconductor pad section.

Still another object of the present invention is to provide first and second engagement means upon the semiconductor pad section support bars and the lead-frame frame-members, respectively, with the second engagement means provided upon the frame members at predetermined positions along the longitudinal extent thereof, such that when the semiconductor pad section and the support bars thereof are in fact engagingly mated with the lead-frame frame-members as a result of the engagement of the first and second engagement means thereof, the semiconductor pad section and support bars, as well as the semiconductor element disposed upon the semiconductor pad section, will be precisely and accurately located in the lateral directions relative to the inner leads of the lead frame whereby the wire bonding process for interconnecting the terminals of the semiconductor element with the inner leads of the lead frame can be rapidly and efficiently achieved.

SUMMARY OF THE INVENTION

In accordance with one aspect of the present invention, the above and other objectives of the present invention are attained by providing a lead frame for use in the fabrication of a semiconductor device, in which a pad section or die pad for mounting a semiconductor element thereon, and a lead section, are separately so as to be subsequently coupled together. In this manner, the adverse effects of the thermal processing of the die pad and semiconductor element are not impressed upon the lead sections of the lead frame.

In accordance with another aspect of the present invention, the aforenoted and other objectives are attained by providing a method of fabricating a semiconductor device which comprises the steps of fixedly mounting a semiconductor element upon the die pad section of the lead frame, fittingly interconnecting the pad section with the lead section of the lead frame, and then subjecting the interconnected assembly to a wire bonding and resin sealing process.

In accordance with still another aspect of the present invention, the aforenoted and other objectives of the present invention are attained through means of a lead frame including a frame member, outer leads, inner leads, and tie bars interconnecting the inner and outer leads together; and a die pad section, having support bars projecting outwardly from opposite side edge portions thereof, for supporting a semiconductor element thereon. The lead-frame frame-member, with its leads and tie bars, is fabricated separately from the die pad section for supporting the semiconductor element thereon, and in order to precisely or accurately locate the die pad section and the semiconductor element supported thereon, relative to the inner leads of the lead-frame frame-member, the free or distal ends of the die pad support bars are provided with first engagement means in the form of male bulbous portions, while the frame members of the lead frame are provided with corresponding female recessed portions. The female recessed portions of the frame members are located at predetermined locations along the longitudinal extent of the frame members such that when the first and second male and female engagement means of the support bars and frame members are in fact engaged, the support bars, and semiconductor element die pad supported thereby, are fixed or locked in position with respect to any lateral movement thereof along the longitudinal extent of the frame members. In this manner, the semiconductor element die pad, and the semiconductor element fixed thereon, is precisely and accurately positioned relative to the inner leads of the lead frame whereby proper, rapid, and efficient wire bonding of the semiconductor element terminals to the inner leads of the lead frame can in fact be readily achieved.

BRIEF DESCRIPTION OF THE DRAWINGS

Various other objects, features, and attendant advantages of the present invention will be more fully appreciated as the same becomes better understood from the following detailed description when considered in connection with the accompanying drawings, in which like reference characters designate like or corresponding parts throughout the several views, and wherein.

DETAILED DESCRIPTION OF THE PREFERRED EMBODIMENT

Figure 1:
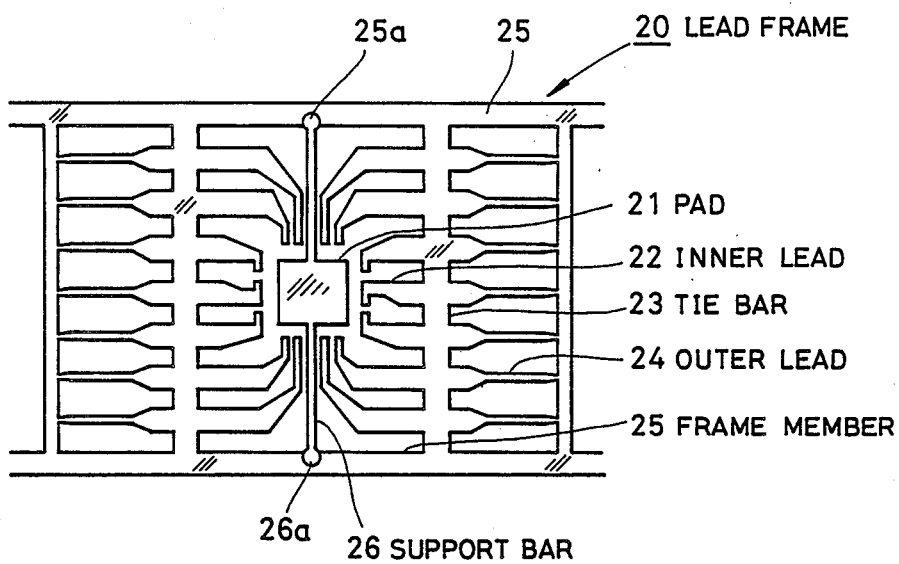
FIG. 1 is a plan view of a lead frame constructed in accordance with the present invention.

Referring now to the drawings, and more particularly to FIG. 1 thereof, there is shown an embodiment of a lead frame 20 constructed in accordance with the present invention and comprising a die pad section and a lead section with the pad section being fabricated separately from the lead section and adapted to be subsequently connected to or mated with the lead section. In particular, the pad section includes a pad 21 and a pair of support bars 26 which project outwardly from opposite side edge portions of the pad 21, while the lead section comprises a plurality of inner leads 22, a plurality of outer leads 24, interconnecting tie bars 23, and a frame member 2 which includes upper and lower laterally extending portions as viewed in the drawing figure.

Figure 2:
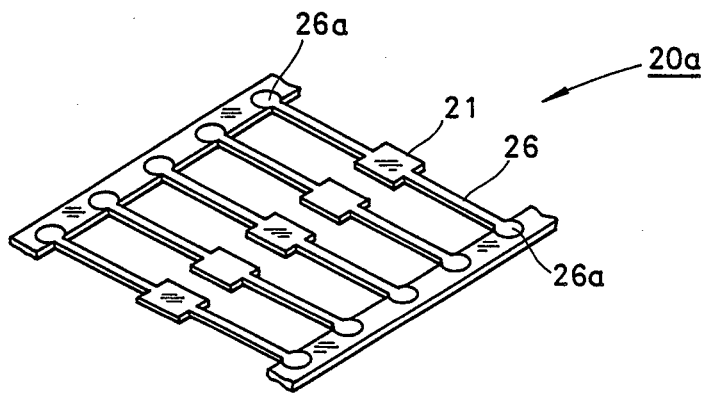
FIG. 2 is a perspective view of a plurality of semiconductor element die pad sections as produced for use within the lead frame of FIG. 1.
Figure 3:
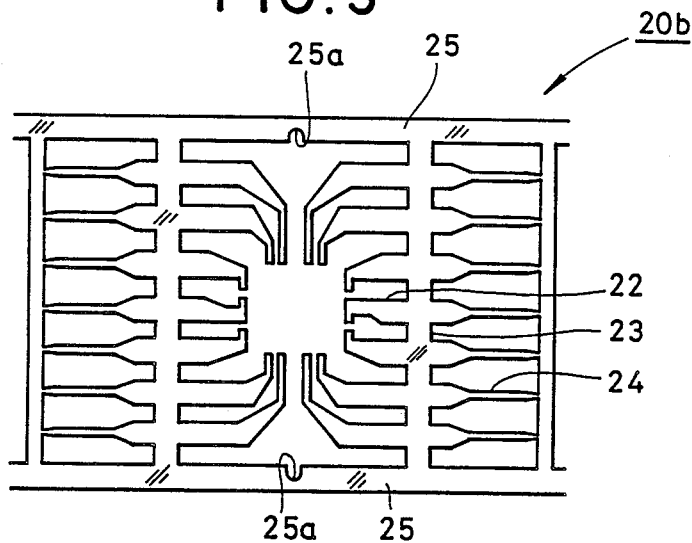
FIG. 3 is a plan view of the lead section of the lead frame shown in FIG. 1.
Figure 4:
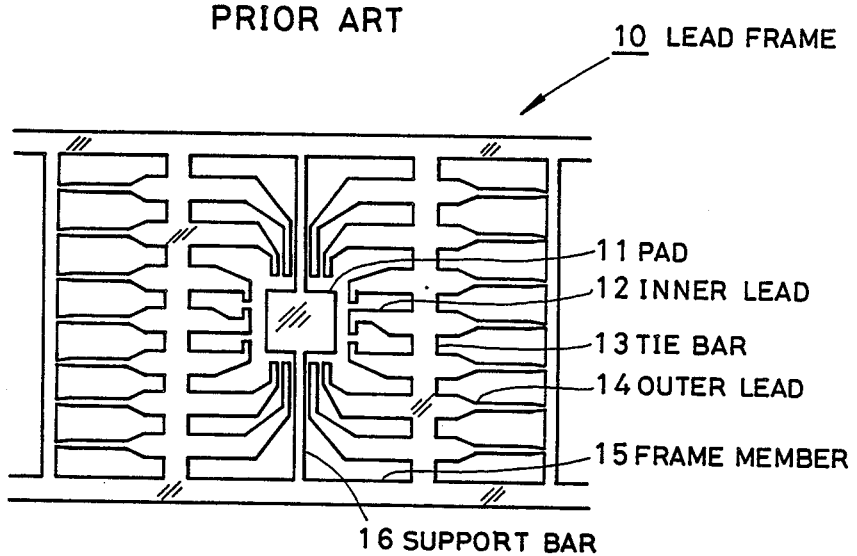
FIG. 4 is a plan view of a PRIOR ART lead frame.

As can be further appreciated with reference being made to FIGS. 2 and 3, the pad and lead sections 20a and 20b, respectively, are fabricated separately by means of, for example, blanking or etching processes. More specifically, it is seen that the support bars 26 are provided at their free or distal ends with bulbous enlargements 26a, while the frame member 25 is correspondingly provided with similarly configured recesses 25a at diametrically opposed positions thereof, that is, upon the upper and lower laterally extending frame member portions as viewed in FIGS. 1 and 3. In this manner, the pad section 20a can be fittingly engaged within the lead section 20b as a result of the interengagement of the first male engagement means 26a of the pad section 20a within the second female engagement means or recesses 25a of the lead section 20b. FIG. 1 shows the lead frame 20 in its fully assembled condition which is obtained when in fact the pad section 20a of FIG. 2 is interengaged with and secured within the lead section 20b of FIG. 3. As can be especially appreciated from the assembled condition of FIG. 1, as a result of the provision of the engagement recesses 25a within the lead section 20b of the lead frame 20, at predetermined locations along the longitudinal extent of the upper and lower, laterally extending portions or frame members 25, and the interengagement of the engagement means 26a of the pad section support bars 26 within the recesses 25a, the die pad 21 and the semiconductor element, not shown, disposed thereon, are precisely and accurately located in the lateral directions relative to the inner leads 22, and more particularly, with respect to the free or distal end tip portions of the inner leads 22, such that proper, rapid, and efficient wire bonding between the semiconductor element terminals and the inner leads 22 can in fact be achieved. This is due to the fact that as a result of the aforenoted engagement of the first engagement enlargements or projections 26a of the pad section 20a with the second female engagement recesses 25a of the frame members 25, and the resulting disposition of the die pad 21 and the semiconductor element disposed thereon relative to the inner leads 22, the spacings defined between the side edge portions of the pad section 21, upon opposite sides thereof, and the free or distal ends of the inner leads 22, are uniform. Considered from another viewpoint, the position of the pad section 21 and the semiconductor element, not shown, disposed thereon, relative to the tip portions of the inner leads is already predetermined and locked or fixed in the lateral direction as viewed in FIG. 1. This is a significant advance over the known prior art in view of the fact that while different means may have heretofore been employed so as to interconnect separate pad and frame sections of the lead frame together, no prior art has heretofore taught the precise lateral positioning or location fixing of the pad section, relative to the frame or lead section, by the provision of, for example, male and female interengagement means, and in particular, the provision or disposition of the engagement means upon the frame members of the lead section at predetermined locations thereof along the longitudinal extents thereof.

It is to be appreciated further that since the lead frame 20 comprises the pad section 20a and the lead section 20b which may be formed or fabricated separately from each other, the sections 20a and 20b can, if so desired, be fabricated respectively from different plate materials or from plates having different thicknesses. In particular, for example, in order to lessen or reduce the thermal effects of heat upon the semiconductor device of the present invention which may be generated during the mounting of the semiconductor element upon the pad 21, it may be preferable to fabricate the pad section 20a from a material which exhibits a relatively small thermal coefficient of expansion and a high degree of hardness, whereas the lead section 20b may be preferably fabricated from a material which exhibits good electrical conductivity and plating characteristics. Furthermore, when the pad section 20a is fabricated so as to have a thickness which is greater than that of the lead section 20b, the heat radiation efficiency can be improved.

Alternatively, the pad section 20a and the lead section 20b may in fact be fabricated from the same plate having, of course, the same thickness and the same material composition. In this case, the adverse thermal effects of the heat generated during the mounting of the semiconductor element upon upon the semiconductor die pad can be eliminated or substantially reduced with respect to the lead section 20b of the semiconductor device by fabricating the semiconductor device in accordance with the following process.

In particular, with the die pad section 20a separated or detached from the lead section 20b, the semiconductor element, not shown, is fixedly mounted upon the pad 21. The pad section 20a, having the semiconductor element mounted thereon, is then engaged with and into the lead section 20b by means of the first and second male and female engagement means 26a and 25a, respectively, and is thereafter subjected, as in the prior art, to a wire bonding process, a resin sealing process, and a trimming and forming process, such processes therefore completing the fabrication of the semiconductor device. It is to be yet further appreciated that this method of fabricating the semiconductor device can of course be utilized even in the instance wherein the pad and lead sections 20 and 20b, respectively, are fabricated from different plate materials having different thickness dimensions.

Although the pad section 20a has been disclosed as including the die pad 21 per se and the support bars 26 integrally formed therewith, the pad section 20a can be produced so as to solely define the die pad 21 per se while the support bars 26 would be produced independently of the die pad 21 per se. In this instance, it is contemplated that the die pad 21 and the support bars 26 could be provided with female and male recesses and enlargements, respectively, in a manner similar to the recesses 25a and enlargements of the support bars 26, respectively, so as to permit engagement and interconnection of the support bars 26 and the die pad 21. It is further noted that while the enlargements 26a and the recesses 25a of the support bars 26 and frame members 25 have been disclosed as having circular configurations, the recesses and enlargements can of course be provided with other geometrical configurations or shapes, such as, for example, triangles, squares, or the like.

Continuing still further, while a dual-in-line lead frame has been disclosed within the illustrated embodiment and accompanying drawing figures, the present invention is in no way limited to the particular type of lead frame and can, for example, have its teachings applied to, for example, a quad lead frame.

Obviously, many modifications and variations of the present invention are possible in light of the above teachings. It is therefore to be understood that within the scope of the appended claims, the present invention may be practiced otherwise than as specifically described herein.

What is claimed as new and desired to be protected by means of Letters Patent of the United States is:

1. A lead frame for use in the fabrication of a semiconductor device, comprising:
   a lead section comprising inner leads, outer leads, tie bars for supporting and interconnecting said inner leads and said outer leads together, and a frame member having a predetermined longitudinal extent;
   a pad section comprising a pad, for carrying a semiconductor element thereon, and support bar means extending outwardly from said pad toward said frame member for supporting said pad upon said frame member;
   said support bar means of said pad section having either one of first male or female engaging means defined upon free distal end portions thereof; and
   said frame member having correspondingly opposite second male or female engaging means defined at predetermined locations along said longitudinal extent thereof and relative to said inner leads of said lead section for engaging said first engaging means of said support bar means when said support bar means and said first engaging means thereof is engagingly mated with said frame member and said second engaging means thereof such that said pad is precisely and accurately located and positioned with respect to said inner leads of said lead section.

2. A lead frame as set forth in claim 1, wherein:
said pad section is made from a first material and said lead section is made from a second material which is different from said first material comprising said pad section.

3. A lead frame as set forth in claim 1, wherein:
said pad and lead sections have different thickness dimensions.

4. A lead frame as set forth in claim 2, wherein:
said first material has a small thermal coefficient of expansion and a high degree of hardness, while said second material has good electrical conductivity and good plating characteristics.

5. A lead frame as set forth in claim 1, wherein:
said support bar means comprises a pair of support bars extending in opposite directions outwardly from opposite side edge portions of said pad.

6. A lead frame as set forth in claim 5, wherein:
said first engaging means of said support bar means comprises a projection provided at the end of each one of said pair of support bars; and
said second engaging means of said frame member comprises a pair of recesses provided upon said frame member.

7. A lead frame as set forth in claim 1, wherein:
said pad section and said lead section are made from the same material.

8. A lead frame as set forth in claim 1, wherein:
said pad section and said lead section have the same thickness dimensions.

9. A lead frame as set forth in claim 1, wherein:
said frame member comprises opposed frame member sections longitudinally spaced apart; and
said pad is disposed substantially centrally between said tie bars in a direction extending laterally between said tie bars, and substantially centrally between said frame member sections in a direction extending longitudinally between said frame member sections.

10. A lead frame as set forth in claim 6, wherein:
each of said projections has a substantially circular configuration; and
each of said recesses has a substantially circular configuration.

11. A lead frame as set forth in claim 5, wherein:
said support bar members extend substantially parallel to said tie bars.

12. A lead frame as set forth in claim 5, wherein:
said support bar members extend substantially perpendicular to said frame member.

13. A lead frame as set forth in claim 3, wherein:
said pad section has a greater thickness dimension than said lead section so as to enhance the heat radiation efficiency thereof.

14. A lead frame as set forth in claim 1, wherein:
said second engaging means of said frame member are located substantially centrally within said frame member along said longitudinal extent thereof.

15. A lead frame as set forth in claim 1, wherein:
said inner and outer leads are substantially co-linear with respect to each other.

16. A lead frame as set forth in claim 1, wherein:
said inner and outer leads are disposed substantially parallel to said frame member.

17. A lead frame as set forth in claim 1, wherein:
said inner leads have free end portions thereof dispose in a substantially square array; and
said pad is disposed substantially centrally within said substantially square array so as to have its opposite edge portions disposed substantially equidistant from oppositely disposed free end portions of said inner leads.

18. A lead frame for use in the fabrication of a semiconductor device, comprising:
a lead section comprising inner leads, outer leads, tie bars for supporting and interconnecting said inner lead and said outer leads together, and a frame member having a predetermined longitudinal extent;
a pad section comprising a pad, for carrying a semiconductor element thereon, and support bar means extending outwardly from said pad toward said frame member for supporting said pad upon said frame member;
said support bar means of said pad section having either one of first male or female engaging means defined upon free distal end portions thereof; and
said frame member having correspondingly opposite second male or female engaging means defined at predetermined locations along said longitudinal extent thereof and relative to said inner leads of said lead section for engaging said first engaging means of said support bar means, when said support bar means and said first engaging means thereof is engagingly mated with said frame member and said second engaging means thereof, such that said pad section and said pad are lockingly engaged within said frame member so as to be prevented from undergoing any lateral movement with respect to said inner leads of said lead section along said longitudinal extent of said frame member whereby said pad is precisely and accurately located and positioned with respect to said inner leads of said lead section.

19. A lead frame as set forth in claim 18, wherein:
said inner leads have free end portions thereof disposed in a substantially square array; and
said pad is disposed substantially centrally within said substantially square array so as to have its opposite edge portions disposed substantially equidistant from oppositely disposed free end portions of said inner leads.

20. A lead frame as set forth in claim 18, wherein:
said frame member comprises a pair of opposed frame member sections longitudinally spaced apart; and
said support bar means comprises a pair of support bars extending in opposite directions outwardly from opposite side edge portions of said pad toward said pair of opposed frame member sections.

* * * * *